United States Patent [19]

Narukawa et al.

[11] Patent Number: 4,468,630

[45] Date of Patent: Aug. 28, 1984

[54] WIDE-BAND AMPLIFIER FOR DRIVING CAPACITIVE LOAD

[75] Inventors: Yasunori Narukawa; Mitsunobu Iwabuchi, both of Tokyo, Japan

[73] Assignee: Hitachi Denshi Kabushiki Kaisha, Tokyo, Japan

[21] Appl. No.: 405,221

[22] Filed: Aug. 5, 1982

[30] Foreign Application Priority Data

Aug. 8, 1981 [JP] Japan .................. 56-124384

[51] Int. Cl.³ .................. H03F 3/26; H03G 5/16
[52] U.S. Cl. .................. 330/267; 330/132; 330/273
[58] Field of Search .............. 330/71, 123, 132, 262, 330/263, 267, 273, 278, 294, 296

[56] References Cited

U.S. PATENT DOCUMENTS 3,781,703  12/1973  Duty .................. 330/132

FOREIGN PATENT DOCUMENTS 47-7403  3/1972  Japan .
56-23322  5/1981  Japan .

Primary Examiner—James B. Mullins
Assistant Examiner—Gene Wan
Attorney, Agent, or Firm—Remy J. VanOphem

[57] ABSTRACT

A wide-band amplifier for driving a capacitive load includes an amplifier of a complementary push-pull circuit receiving and amplifying an input signal to produce an output signal for driving the capacitive load, and a controller for controlling bias current of the amplifier in response to a detected output derived from a high frequency component in the output signal of the amplifier. The controller makes the bias current of the amplifier variable with frequency and amplitude of the input signal.

4 Claims, 1 Drawing Figure

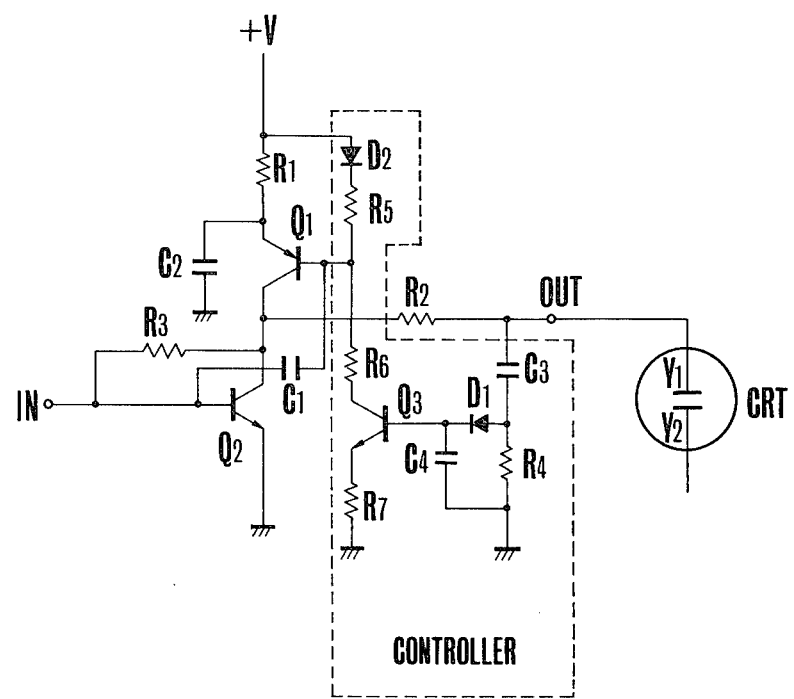

WIDE-BAND AMPLIFIER FOR DRIVING CAPACITIVE LOAD

BACKGROUND OF THE INVENTION

This invention relates to an improved wide-band amplifier adapted to drive a capacitance load linearly over a broad range of frequencies.

In an oscilloscope using an electrostatic deflection type cathode-ray tube, the vertical deflection is obtained by applying an input signal between vertical deflection electrodes after amplifying it with fidelity. To cope with the increase of the frequency range covered in oscilloscope observation, a wide-band linear amplifier is usually used for the vertical deflection purpose.

Usually, a Class A wide-band amplifier is used as a vertical deflection amplifier. Since a considerable electrostatic capacitance is present between the vertical deflection electrodes, the load impedance of the vertical deflection amplifier of this class reduces with increasing input signal frequencies. For this reason, the vertical deflection amplifier requires considerable output power for a sufficient driving voltage of high frequencies.

In order to permit considerable output power and nevertheless insure a satisfactory linearity, the vertical deflection amplifier is made to carry a large bias current, and the operating point is set to the optimum point in the input/output characteristic.

However, when the input signal amplitude is low though the signal frequency may be high or when the input signal frequency is low so that the load impedance is high, substantially no large bias current is required. Since the vertical deflection amplifier carries a large current even in such cases, its power consumption is increased correspondingly, which is undesired in view of economy. Particularly, in a portable oscilloscope the battery power supply is soon used up due to high power consumption by the vertical deflection amplifier.

Attempts have been made to cope with this drawback; for example there have been proposed a "Self-adaptable Amplifier" (disclosed in Japanese Patent Publication No. 7403/1972) and "Amplifier Circuit" (disclosed in Japanese Patent Publication No. 23322/1981). These circuits, however, have complicated constructions and cannot be produced inexpensively.

SUMMARY OF THE INVENTION

A primary object of the present invention is to obviate the above conventional drawbacks and to provide a wide-band amplifier of a simplified construction capable of reducing power source consumption for low-amplitude and low-frequency input signals and to assure linearity and output power commensurate with increasing amplitude and frequency of the input signal.

According to the invention, a wide-band amplifier for driving a capacitive load includes an amplifier of a complementary push-pull circuit receiving and amplifying an input signal to produce an output signal for driving the capacitive load, and a controller for controlling bias current of the amplifier in response to a detected output derived from a high frequency component in the output signal of the amplifier, whereby the bias current of the amplifier is made variable with frequency and amplitude of the input signal by the controller.

BRIEF DESCRIPTION OF THE DRAWING

The single FIGURE is a circuit diagram showing an embodiment of the invention.

DESCRIPTION OF PREFERRED EMBODIMENT

Now, an embodiment of the invention will be described in detail with reference to the circuit diagram of the accompanying drawing.

Referring to a single figure in the drawing, a PNP transistor $Q_1$ and NPN transistor $Q_2$, these transistors individually having satisfactory frequency characteristics, form a complementary push-pull circuit having a grounded one end. The collectors of these transistors are connected to each other, the emitter of the transistor $Q_2$ is grounded, and the emitter of the transistor $Q_1$ is connected to a voltage source $+V$ through a resistor $R_1$.

An input signal which is supplied to an input terminal IN, is led directly to the base of the transistor $Q_2$, while it is led to the base of the transistor $Q_1$ through a capacitor $C_1$. Both the transistors $Q_1$ and $Q_2$ are excited in the same phase, and their internal impedance are changed complementarily. Thus, their collector junction potential is changed according to the input signal, and it is coupled through a resistor $R_2$ to an output terminal OUT for driving a vertical deflection electrode $Y_1$ in a cathode-ray tube CRT.

The transistor $Q_1$ is self-biased through a negative feedback resistor $R_3$. A capacitor $C_2$ is provided for being discharged to provide current when the current through the transistors $Q_1$ and $Q_2$ is suddenly increased. It is connected to the resistor $R_1$ and is normally held charged.

A deflection electrode $Y_2$ is driven in an opposite phase relation to the deflection electrode $Y_1$ by an amplifier, not shown, which has the same construction as that of the amplifier described above which forms the transistors $Q_1$ and $Q_2$.

A controller CNT is provided in parallel connection with respect to the output terminal OUT. The controller includes a series circuit which includes a capacitor $C_3$ and a resistor $R_4$, which extracts high frequency components from the output signal of the amplifier that is coupled through the resistor $R_2$. The terminal voltage across the resistor $R_4$ is coupled to a detector which includes a diode $D_1$ and a capacitor $C_4$. The detector detects a high frequency component, and its output is supplied as a forward bias to a transistor $Q_3$.

When the input signal frequency is increased, the collector current in the transistor $Q_3$ is increased. The increased collector current passes through a diode $D_2$ and resistors $R_5$ and $R_6$, these being connected between the collector of the transistor $Q_3$ and the voltage source $+V$, and also through a resistor $R_7$ connected between the emitter of the transistor $Q_3$ and ground. Thus, the potential on the junction between the resistors $R_5$ and $R_6$ is reduced to increase the forward bias to the power supply side transistor $Q_1$ of the complementary push-pull circuit, which transistor has its base connected to the junction. With this increase, the bias current in the transistors $Q_1$ and $Q_2$ is increased causing the operating point to shift to a large output point.

When the input signal amplitude is increased, the terminal voltage across the resistor $R_4$ is increased even if the signal frequency is low. As a result, the bias current in the transistors $Q_1$ and $Q_2$ is increased.

The transistors $Q_1$ and $Q_2$ thus may be normally held under the application of a sufficiently low bias that causes no crossover distortion. Thus it is possible to reduce power consumption. In addition, the operating point can be automatically corrected by an increase of the input signal amplitude or frequency. For this reason, the vertical deflection electrodes $Y_1$ and $Y_2$, which have a capacitive character, can be driven with sufficient power after amplifying the input signal with a satisfactory linearity.

Further, the complementary push-pull circuit which mainly includes the transistors $Q_1$ and $Q_2$, can basically operate as a low bias current Class B amplifier, as well as providing for a linear input output characteristic over a broad range and being capable of readily obtaining a greater output than is obtainable with a Class A amplifier which includes a collector side load resistor.

The capacitance of the capacitor $C_3$ is desirably less than the electrostatic capacitance between the vertical deflection electrodes $Y_1$ and $Y_2$. The relation between values of the capacitor $C_3$ and resistor $R_4$ may be determined according to the frequency and amplitude at which the bias current is to be increased.

The above embodiment of the invention may be modified in various ways. For example, a resistor may be connected in parallel with the capacitor $C_3$. Alternatively, a cascade connection of a plurality of stages of highpass filters each formed of a capacitor and a resistor may be used in lieu of the capacitor $C_3$. Further, the detector consisting of the diode $D_1$ and the capacitor $C_4$ may be replaced with a full-wave detector. Also, the detector output may be amplified in the same phase for controlling the bias to the transistor $Q_1$.

As has been made apparent from the foregoing, according to the invention a wide-band amplifier which consumes low power for low-amplitude and low-frequency input signals, can be obtained, and with increasing amplitude and frequency of the input signal, corresponding linearity and output power are provided. The life of the battery power supply thus can be extended with the wide-band amplifier according to the invention, which may be used not only for driving the electrostatic deflection type cathode-ray tube deflection electrodes but also for driving various other capacitive loads covering wide frequency ranges such as piezoelectric electroacoustic transducers, particularly various portable electronic apparatus.

What is claimed is:

1. A wide-band amplifier for driving a capacitive load comprising:
    push-pull amplifier means receiving and amplifying an input signal to produce an output signal for driving said capacitive load; and
    controller means responsive to said output signal of said push-pull amplifier means to control bias current thereof, said controller means further comprising a circuit for extracting a high frequency component in said output signal of said push-pull amplifier, a detector circuit for detecting an extracted output signal, and a circuit responsive to a detector output signal to control bias current of one transistor constituting said push-pull amplifier means.

2. A wide-band amplifier for driving a capacitive load comprising:
    an amplifier of a complementary push-pull circuit grounded at one end which receives and amplifies an input signal to produce an output signal for driving said capacitive load;
    a series circuit comprised of a capacitor and a resistor for extracting high frequency components, said series circuit being connected to the output side of said amplifier;
    a diode for detecting a terminal voltage across said resistor; and
    a transistor responsive to an ouput of said diode for controlling the bias current supplied to a power supply side transistor in said amplifier.

3. A wide-band amplifier according to claim 2 wherein the relation between values of said capacitor and said resistor is determined according to the frequency and amplitude at which the bias current is to be increased.

4. A wide-band amplifier according to claim 2 wherein said capacitor has a capacitance which is less than that of said capacitive load.

* * * * *